United States Patent [19]

Takayama

[11] Patent Number: 4,975,658
[45] Date of Patent: Dec. 4, 1990

[54] HIGH FREQUENCY AMPLIFIER CIRCUIT WITH NOISE FIGURE IMPROVEMENT

[75] Inventor: Masami Takayama, Saitama, Japan

[73] Assignee: Pioneer Electronic Corporation, Tokyo, Japan

[21] Appl. No.: 297,802

[22] Filed: Jan. 17, 1989

[30] Foreign Application Priority Data

Jul. 22, 1988 [JP] Japan ................. 63-181716

[51] Int. Cl.[5] .................. H03F 1/34; H03F 3/191
[52] U.S. Cl. ................................ 330/294; 330/306
[58] Field of Search ............. 330/277, 294, 300, 302, 330/303, 304, 305, 306, 310

[56] References Cited

U.S. PATENT DOCUMENTS

| | | | |
|---|---|---|---|
| 3,810,256 | 5/1974 | Van Doorn | 330/306 X |
| 4,590,434 | 5/1986 | Wagner | 330/294 X |
| 4,749,759 | 6/1988 | Cripps et al. | 330/277 |
| 4,774,477 | 9/1988 | Rodes et al. | 330/277 |

FOREIGN PATENT DOCUMENTS

| | | |
|---|---|---|
| 2953382 | 6/1980 | Fed. Rep. of Germany . |
| 3407020 | 9/1984 | Fed. Rep. of Germany . |
| 2605817 | 4/1988 | France ................. 330/306 |
| 0118758 | 9/1979 | Japan ................. 330/306 |
| 1224960 | 4/1986 | U.S.S.R. .............. 330/306 |

OTHER PUBLICATIONS

Search Report (West German).
"Advances in Solid-State Power Supplies for RF Heating", *Electronics & Wireless Word*, Oct. 1988, pp. 1013-1015, 1022.
"Vorverstarker fur SSB-Emfanger", *Elector*, Oct. 1982, pp. 10-56-10-57.

Primary Examiner—Steven Mottola
Attorney, Agent, or Firm—Sughrue, Mion, Zinn, Macpeak & Seas

[57] ABSTRACT

A high frequency, negative feedback amplifier is coupled at its input to an inductance network which together with the input capacitance of the negative feedback amplifier forms a resonance circuit. The resonance frequency of the resonance circuit is set within the desired reception band of the amplifier, to thereby form a band pass filter having a pass band corresponding to the desired reception band. The resonance circuit assures only a real input to the amplifier thereby reducing the input noise attributable to the input source.

10 Claims, 4 Drawing Sheets

HIGH FREQUENCY AMPLIFIER CIRCUIT WITH NOISE FIGURE IMPROVEMENT

BACKGROUND OF THE INVENTION

1. Field of the Invention

The present invention generally relates to a high frequency amplifier circuit for high frequency amplifying a signal received through an antenna, and particularly relates to a high frequency amplifier circuit. for example. provided in an antenna input circuit for an FM receiving apparatus. for example, as an antenna booster circuit in order to improve the receiving sensitivity of the FM receiving apparatus.

2. Background Art

A conventional high frequency amplifier circuit of the type described above is in the form of a negative feedback amplifier circuit A with its input directly connected to an antenna AMI, as shown in FIG. 1. The negative feedback amplifier circuit has advantages in that a wide band frequency characteristic suitable as an antenna input circuit can be obtained owing to its negative feedback, noise immunity can be reduced, and so on. In addition to these advantages, the negative feedback amplifier circuit has the feature that by making its negative feedback rate large (i.e., equal to or near 1 (one)) it is possible to make its input impedance high and its output impedance low to thereby make the internal resistance of the negative feedback amplifier circuit viewed from the output side very small so that the circuit is hardly subject to the influence of load impedance.

On the other hand. it is required to increase the gain of a high frequency amplifier circuit without increasing its noise figure. To satisfy this requirement, it is necessary to make the negative feedback amplifier circuit A have a low noise and high gain characteristic. If an amplifier circuit is made to have such a characteristic, however, the distortion generated on reception of an intensive input (at the time of overload) becomes large. In order to minimize the distortion generated on reception of an intensive input, it is necessary to make the feedback rate of the negative feedback amplifier circuit A very large. However, it is impossible to obtain a sufficient gain.

In short. in the conventional circuit described above with reference to FIG. 1, there has been the problem in that if its negative feedback rate is made large, the noise figure NF thereof expressed by the respective ratios of Si/Ni and So/No at the input and output sides of the amplifier circuit, respectively, is so deteriorated that its practical sensitivity does not rise sufficiently to a value required for such a circuit.

SUMMARY OF THE INVENTION

It is therefore an object of the present invention to solve the foregoing problem in the prior art.

It is another object of the present invention to provide a high frequency amplifier circuit to improve its noise figure, that is, its practical sensitivity, without increasing the gain of a negative feedback amplifier circuit.

The foregoing objects are attained by a high frequency amplifier circuit comprising a negative feedback amplifier circuit for high frequency amplifying a signal received through an antenna, and a network provided in the input of the negative feedback amplifier circuit so as to constitute a resonance circuit together with the input capacitance of the negative feedback amplifier circuit, the resonance frequency of the resonance circuit being set within the reception band to thereby form a band pass filter having a pass band substantially corresponding to the reception band.

In the above-mentioned configuration, a resonance circuit is provided in the input of the negative feedback amplifier circuit in a manner so that the resonance frequency of the resonance circuit is set within the reception band of the receiving apparatus connected with the high frequency amplifier circuit to thereby form a band pass filter having a pass band substantially corresponding to the reception band. Accordingly, the impedance of the negative feedback amplifier circuit viewed from the antenna side is composed of only a resistive component so that a maximum input is entered into the negative feedback amplifier circuit to make it possible to increase the output voltage of the negative feedback amplifier circuit without increasing its gain. Accordingly, the noise figure is not deteriorated by the increase gain, so that it is possible to improve the amplifier's practical sensitivity.

BRIEF DESCRIPTION OF THE DRAWINGS

Other features and advantages of the present invention still be apparent from the following description taken in connection with the accompanying drawings, wherein.

DETAILED DESCRIPTION OF THE PREFERRED EMBODIMENT

An embodiment of the present invention will be described with reference to the drawings. It is to be understood, however, that the present invention is not limited to the preferred embodiment disclosed herein, and that the invention encompasses all embodiments within the scope of the appended claims.

Figure 1:
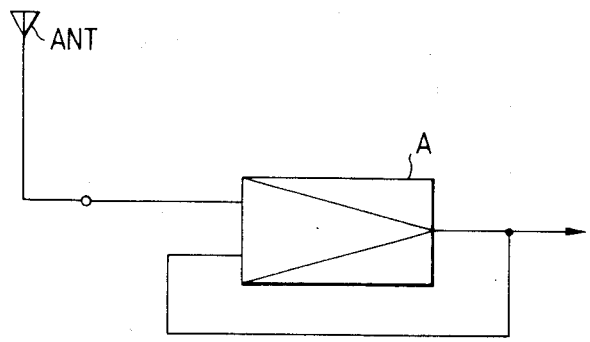
FIG. 1 is a circuit diagram illustrating an example of a conventional circuit.
Figure 2:
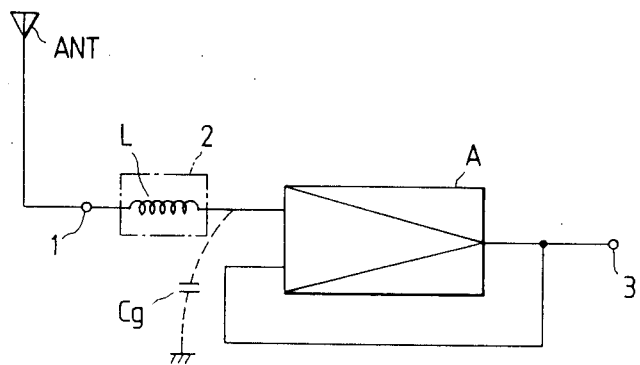
FIG. 2 is a circuit diagram illustrating an embodiment of the high frequency amplifier circuit according to the present invention.

FIG. 2 is a circuit diagram illustrating an embodiment of the high frequency amplifier circuit according to the present invention, which is arranged as an antenna booster circuit. In FIG. 2, the antenna booster circuit includes a negative feedback amplifier circuit A and a network 2 connected between the input of the negative feedback amplifier circuit A and an antenna connection terminal 1 connected to an antenna, ANT. The output of the negative feedback amplifier circuit A is connected with a not-shown FM receiving apparatus through an output terminal 3.

The above-mentioned network 2 is constituted by an inductance coil L connected in series between the antenna connection terminal 1 and the negative feedback amplifier circuit A, so that the inductance coil L forms a resonance circuit with a resonance frequency f1 together with the input capacitance Cg of the negative feedback amplifier circuit A. The resonance frequency f1 of this resonance circuit is selected within the reception band, so that the resonance circuit forms a band pass filter (BPF) having a pass band substantially corresponding to the reception band.

Figure 3:
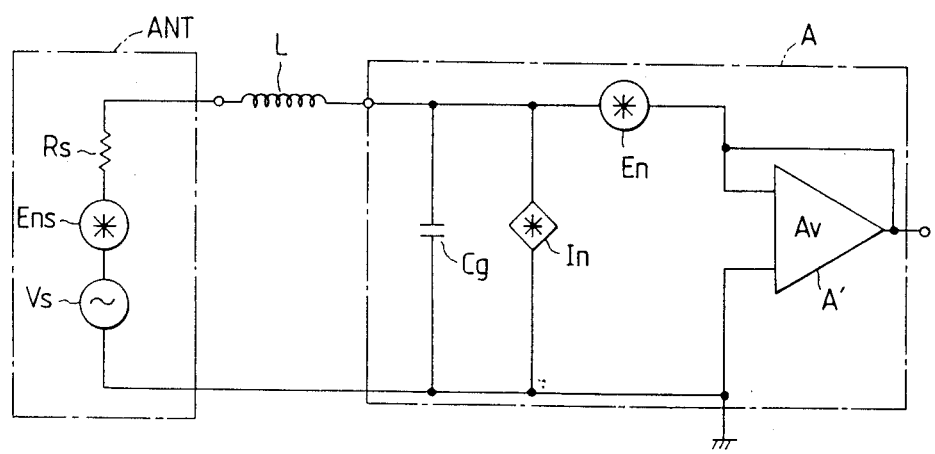
FIG. 3 is a noise equivalent circuit of the circuit of FIG. 2.

FIG. 3 shows a noise equivalent circuit of the circuit of FIG. 2. In FIG. 3, it can be considered that the antenna ANT operates as a signal source constituted by an equivalent signal voltage source Vs, an equivalent noise voltage source Ens and an equivalent resistance Rs. On the other hand, it can be considered that the negative feedback amplifier circuit A is constituted by an equivalent parallel capacitance Cg, an equivalent input noise voltage source En, an equivalent input current source In and a noiseless amplifier A' with a gain Av. An equivalent input noise Eni² in FIG. 3 is expressed by.

$$Eni^2 = Ens^2 + [(1 - \omega^2 CgL)^2 + (\omega RsCg)^2] \cdot En^2 + (Rs + \omega^2 L^2) \cdot In^2 \quad (1)$$

In the above equation (1), the term En takes the minimum value when $\omega^2 CgL = 1$, and the smaller Rs is, the more En becomes negligible. That is, with resonance action, it is possible to reduce the influence of the equivalent input noise voltage in the amplifier circuit.

Next, the operation of negative feedback will be described.

The reason why a feedback circuit is used in an amplifier expected to be under a high input is that the distortion generated upon reception of an intensive input can be substantially eliminated. In a negative feedback amplifier, let an internal noise (for example in the configuration of FIG. 5, a thermal noise due to the winding resistance of a transformer 13) or a distortion be represented by ex. If the internal noise or distortion ex is added to the intermediate point of $\mu = \mu 1 \cdot \mu 2$, the output $e2\beta$ is expressed by, $$e2\beta = \frac{\mu e1}{1 + \mu\beta} + \frac{\mu 2 ex}{1 + \mu\beta} \quad (2)$$

In the equation (2), the first and second terms in the right side represent the signal output and the noise output respectively. At that time, the signal-to-noise ratio is expressed by, $$S/N = \frac{[\mu e1/(1 + \mu\beta)]}{[\mu 2 ex/(1 + \mu\beta)]} = \frac{\mu e1}{\mu 2 ex} = \frac{\mu 1 e1}{ex} \quad (3)$$

Next, the output $e2o = \mu e1 + \mu 2 ex \quad (4)$

Then, the signal-to-noise ratio So/No at this time is expressed as follows:

$$So/No = \frac{\mu e1}{\mu 2 ex} = \frac{\mu 1 e1}{ex} \quad (5)$$

The equation (5) is coincident with the equation (3).

The S/N does not change in the conventional negative feedback circuit. In the circuit of the embodiment according to the present invention, however, by inserting the inductance coil L in the input of the negative feedback circuit so as to step up the input at the input end of the feedback circuit, the internal noise and distortion is reduced as will be described hereinafter.

Assuming now that the degree of step-up at the input end of the negative feedback circuit is $(1+\mu\beta)$-fold, the output $e2\beta'$ at this time is expressed by, $$e2\beta' = \mu e1 + \frac{\mu 2 ex}{1 + \mu\beta}$$

The signal-to-noise ratioh S/N at this time becomes, $$S/N' = \frac{\mu 1 e1}{ex}(1 + \mu\beta)$$

so that the signal-to-noise ratio S/N is improved by a value corresponding to $(1+\mu\beta)$.

The equivalent input noise of the amplifier circuit is expressed by, $$Eni^2 = Ens^2 + En^2 + In^2 Rs^2 \quad (6)$$

Figure 4:
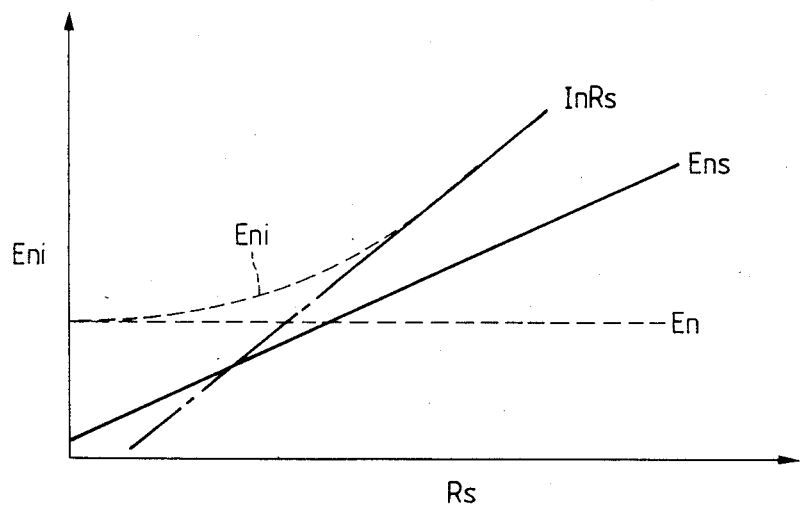
FIG. 4 is a diagram illustrating the relationship between the equivalent input noise of a general amplifier circuit and the signal source resistance.

In the above equation, Ens, En and In represent a signal source noise, an equivalent input noise voltage of the amplifier and an equivalent noise attributed to the input current of the amplifier respectively, and the relation cetween the signal source resistance Rs and the equivalent input noise Eni is shown in FIG. 4. According to the graph of FIG. 4, the equivalent input noise Eni is greatly affected by the signal source noise Ens in the case where the signal source resistance Rs is large, and the equivalent input noise Eni is governed by the value of InRs if Rs is made larger. It is also understood that the equivalent input noise Eni is governed by the equivalent input noise En when the signal source resistance Rs is small.

In the case where the input signal source is considered as an antenna as is in the present invention, it is apparent from measurement results that the real number portion of a signal source impedance (complex impedance) takes a very small value (for example, about 30Ω), and it is therefore believed that the internal noise of the amplifier circuit in this embodiment is governed by the equivalent input noise En. Consequently, it is understood that the noise figure NF can be improved considerably if a resonance circuit is used to minimize the equivalent input noise En, as has been described above. The value of the noise figure NF (nominal value) of a general amplifier element reaches a point wherein En=InRn in FIG. 4, that is, a point where the noise figure NF is minimum in the following NF equation (7).

$$NF = 10 \log \frac{En^2 + Ens^2 + In^2 Rs^2}{Ens^2} \quad (7)$$

Figure 5:
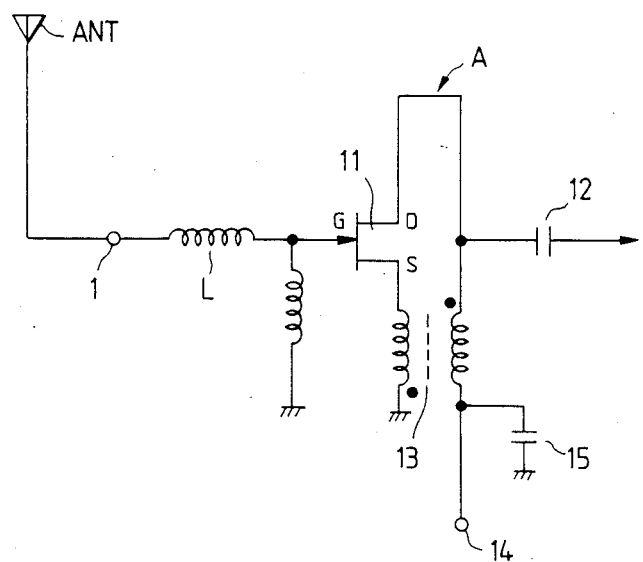
FIG. 5 is a circuit diagram illustrting a specific circuit example of the negative feedback amplifier circuit in the circuit of FIG. 2.

FIG. 5 shows a specific circuit example of the negative feedback amplifier circuit A, where the negative feedback amplifier circuit A includes a field effect transistor (FET) 11 as an amplifier element, and an inductance coil L is connected between the gate G of the FET 11 and an antenna connection terminal 1. The drain of the FET 11 is connected with a not-shown FM receiving apparatus through a DC blocking capacitor 12, and combined with a source of the FET 11 through a negative feedback transformer 13. The negative feedback transformer 13 is made to have a large negative feedback rate equal to or near 1 (one). The reference numeral 14 represents a power supply terminal, and 15 represents a by-pass capacitor.

Considering the case of an FET in the embodiment in FIG. 5, the noise voltage generated in a high frequency band is generally mostly due to thermal noise of a channel. Van dey Ziel explains that this noise depends on the resistance of the channel and is expressed by, $$Rn \approx \left(\frac{2}{3}\right)\left(\frac{1}{gm}\right)$$

From this thermal noise, the value $En^2$ is obtained as follows in accordance with the thermal noise equation, $$En^2 = 4kTRn\Delta f$$

In order to minimize the value En, therefore, it will do to make the FET operate with the maximum value of gm and to this end it is necessary to make the current $I_D$ large. Since, in general, the value gm is maximum in the vicinity of the value $I_{DSS}$, the FET is used under the condition of $I_D=I_{DSS}$ in the embodiment.

Figure 6:
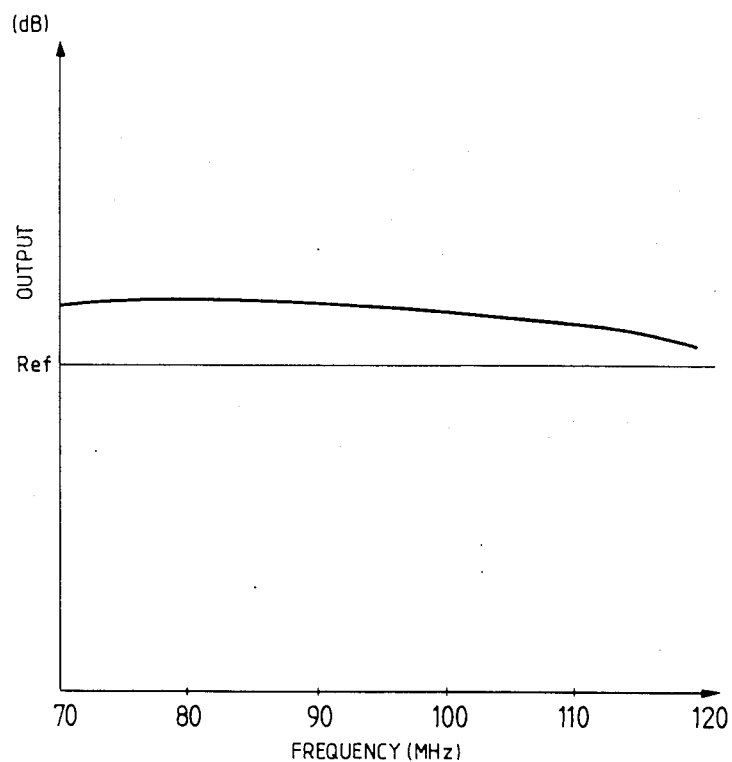
FIG. 6 is a characteristic diagram illustrating a frequency characteristic obtained by the circuit of FIG. 5.

FIG. 6 shows a frequency characteristic obtained by the circuit according to the present invention shown in FIG. 5. The characteristic graph of FIG. 6 is normalized with respect to the reference output level, Ref. As is apparent from FIG. 6, it is possible in the high frequency amplifier circuit according to the present invention, to obtain a substantially flat frequency characteristic in the reception band.

Figure 7:
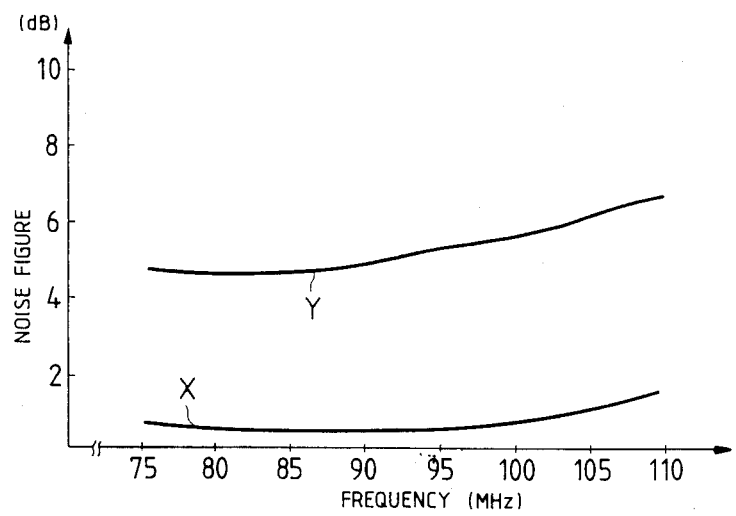
FIG. 7 is a characteristic diagram illustrating a noise figure characteristic obtained by the circuit of FIG. 5.

FIG. 7 is a diagram illustrating noise figure of the circuit according to the present invention in comparison with that of the conventional circuit where the reference signs X and Y represent the characteristic according to the present invention and the conventional characteristic, respectively. As is apparent from FIG. 7, the noise figure is greatly improved in the high frequency amplifier circuit according to the present invention.

Figure 8:
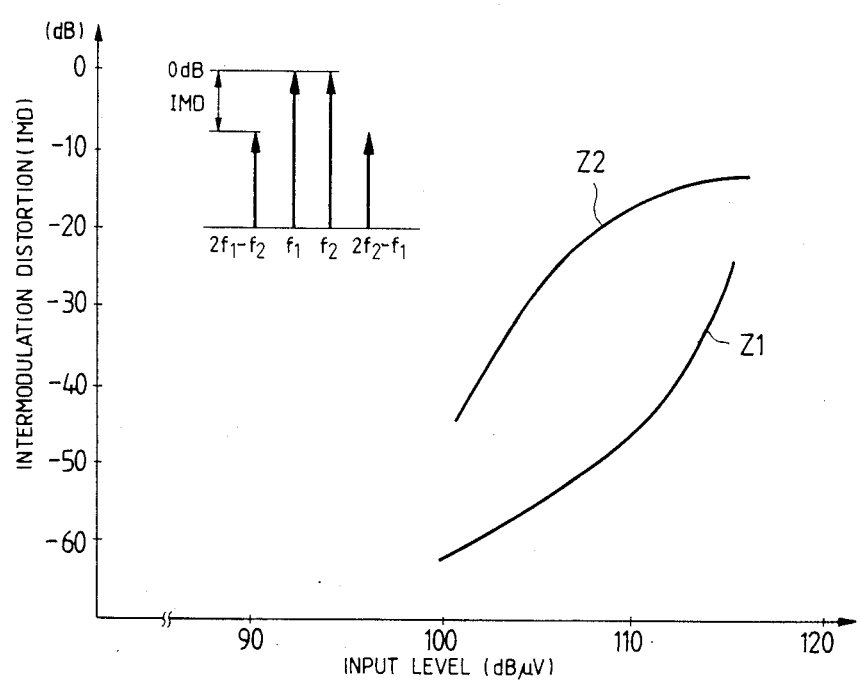
FIG. 8 is a characteristic diagram illustrating an intermodulation characteristic obtained by the circuit of FIG. 5.

FIG. 8 is a characteristic diagram illustrating an intermodulation distortion characteristic obtained by the circuit according to the present invention (FIG. 5). In FIG. 8, the abscissa and ordinate indicate an input LOAD level and a level difference (IMD) between $f_1$ and $(2f_1-f_2)$ respectively, and the reference marks Z1 and Z2 represent characteristics of the amplifier circuit according to the present invention and the conventional amplifier circuit, respectively.

Although a high frequency amplifier circuit used as an FM band antenna booster circuit has been described in the above-mentioned embodiment, the circuit according to the present invention is applicable also to a circuit for a medium wave band such as an AM broadcast in the same manner.

Figure 9:
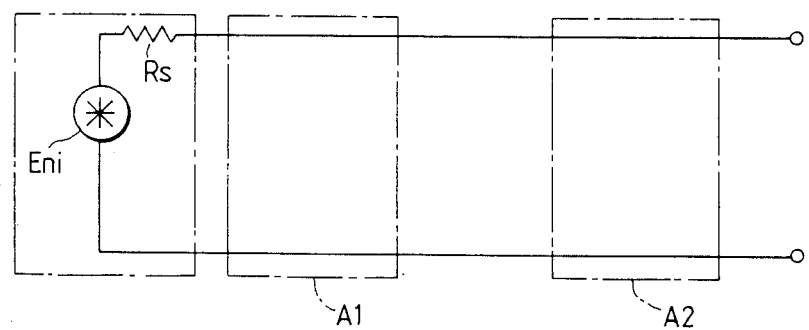
FIG. 9 is a diagram illustrating a circuit to which the circuit according to the present invention is cascade-connected.

FIG. 9 shows a circuit to which the amplifier circuit according to the present invention is cascade-connected, whereby the noise figure NF can be minimized. That is, at first, let the noise figures of circuits A1 and A2 be $F_1$ and $F_2$ respectively, and let their available power gains be $G_1$ and $G_2$ respectively, then the available noise power $N_{i2}$ in the input of the circuit A2 is expressed by, $$N_{i2} = F_1 G_1 kT\Delta f = N_{O1}$$

where $N_{O1}$ represents the output available noise power of the circuit A1. Considering the second stage independently, the noise figure $F_2$ is expressed by, $$F_2 = \frac{NO_2}{G_2 kT\Delta f}$$

so that the noise generated in the second stage is expressed by, $$N_{02} - G_2 kT\Delta f$$

that is, $$(F_2-1)G_2 kT\Delta f$$

Therefore, the whole output noise $N_{OT}$ is expressed by, $$N_{OT} = G_2(F_1 G_1 kT\Delta f) + (F_2-1)G_2 kT\Delta f$$

and the noise figure $F_{12}$ in the circuit of FIG. 9 is expressed by, $$F_{12} = \frac{N_{OT}}{G_1 G_2 kT\Delta f}$$

Substituting the equation of the $N_{OT}$, the following equation is obtained.

$$F_{12} = F_1 + \frac{F_2 - 1}{G_1}$$

The following equation is obtained in the case of three cascade-connected stages in the same manner.

$$F_{123} = F_1 + \frac{F_2 - 1}{G_1} + \frac{F_3 - 1}{G_1 G_2}$$

It is apparent from the equations of the $F_{12}$ and $F_{123}$ that the noise figure of cascade-connected circuits depends on the noise figure and gain of the first stage circuit. Therefore, when the circuit according to the present invention is used as a first stage RF amplifier of a tuner or the like, the noise figure of the whole system becomes small so that the sensitivity thereof can be improved.

As has been described above, according to the present invention, it is possible to raise the output voltage as well as to obtain various other advantages owing to the use of a negative feedback amplifier circuit, so that it is possible to improve practical sensitivity, and at the same time it is possible to reduce the generation of distortion and internal noises in reception of intensive input (overload) by means of negative feedback.

Moreover. since the input capacitance of the negative feedback amplifier circuit is used for forming a resonance circuit, the number of elements to be added for forming the resonance circuit can be minimized so that it is possible to minimize the increase in cost.

Further, since a BPF having a pass band substantially corresponding to a reception band of a receiving apparatus is formed, it is possible to prevent signals outside the band, thereby eliminating interference due to signals outside the pass band.

What is claimed is:

1. A high frequency amplifier circuit comprising:
   a negative feedback amplifier circuit for high frequency amplifying a signal received through an antenna; and
   a network connected to an input of said negative feedback amplifier circuit, said network having no capacitance so that said network consitutes a resonance circuit together with only an input capacitance in said negative feedback amplifier circuit, the resonance frequency of said resonance circuit being set within a reception band to form a bandpass filter having a pass band substantially corresponding to said reception band.

2. An amplifier circuit comprising:
   a negative feedback amplifier circuit for receiving and amplifying an input signal; and
   a network connected to an input of said negative feedback amplifier circuit, said network having no capacitance so that said network constitutes a resonance circuit together with only an input capacitance included in said negative feedback amplifier, the resonance frequency of said resonance circuit being set within a reception band to form a band pass filter having a pass band substantially corresponding to said reception band.

3. An amplifier circuit as claimed in claim 2 wherein said negative feedback amplifier circuit is a high frequency amplifier circuit.

4. An amplifier circuit as claimed in claim 2 wherein said negative feedback amplifier circuit is a medium band frequency amplifier circuit.

5. An amplifier circuit as claimed in claim 2 further including at least one additional amplifier circuit cascade connected to the output of said negative feedback amplifier circuit.

6. An amplifier circuit as claimed in claim 1, wherein said network is comprised of an inductance serially connected between a signal input terminal and the input of said negative feedback amplifier.

7. An amplifier circuit as claimed in claim 6, further including an antenna connected to said input terminal.

8. An amplifier circuit as claimed in claim 2, wherein said network is comprised of an inductance serially connected between a signal input terminal and the input of said negative feedback amplifier.

9. An amplifier circuit comprising:
   a negative feedback amplifier circuit for receiving and amplifying an input signal; and
   a network connected to an input of siad negative feedback amplifier circuit, said network having no capacitance so that said network constitutes a resonance circuit together with only an input capacitance included in said negative feedback amplifier, the resonance frequency of said resonance circuit being set within a reception band to form a band pass filter having a pass band substantially corresponding to said reception band, wherein said negative feedback amplifier circuit comprises a field effect transistor having a gate, a drain and a source, the gate of said field effect transistor receiving said input signal, and a negative feedback transformer having a first coil connected to said drain and a second coil connected to said source.

10. An amplifier circuit as claimed in claim 9, further including means for operating said field effect transistor such that the drain current, $I_D$, is substantially equal to the steady-state drain current $I_{DSS}$, to thereby maximize the transistor transconductance, $g_m$, whereby the transistor thermal noise is minimized.

* * * * *